(12) United States Patent
Shi et al.

(10) Patent No.: US 7,071,779 B2
(45) Date of Patent: Jul. 4, 2006

(54) MONOLITHIC CMOS DIFFERENTIAL LNA WITH ENHANCED LINEARITY

(75) Inventors: Bingxue Shi, Beijing (CN); Jiwei Chen, Beijing (CN)

(73) Assignee: Winbond Electronics, Corp., Hsinchu (TW)

( * ) Notice: Subject to any disclaimer, the term of this patent is extended or adjusted under 35 U.S.C. 154(b) by 76 days.

(21) Appl. No.: 10/871,765

(22) Filed: Jun. 17, 2004

(65) Prior Publication Data

US 2005/0280467 A1    Dec. 22, 2005

(51) Int. Cl.
*H03F 3/45* (2006.01)
(52) U.S. Cl. ..................................... 330/253
(58) Field of Classification Search ............... 330/252, 330/253
See application file for complete search history.

(56) References Cited

U.S. PATENT DOCUMENTS 6,639,468 B1*  10/2003  Belot .................... 330/252
2005/0068106 A1*  3/2005  Irvine ................... 330/260

* cited by examiner

*Primary Examiner*—Robert Pascal
*Assistant Examiner*—Hieu Nguyen
(74) *Attorney, Agent, or Firm*—J.C. Patents

(57) ABSTRACT

A low noise amplifier (LNA) is provided for a first block of a wireless receiver in a wireless communication system using CMOS technology. The LNA includes a first cascode amplifying module and a second cascode amplifying module, where an output signal of the first cascode amplifying module is fed to the second cascode amplifying module in order to cancel third-order intermodulation frequencies (IM3), such that input-referred third-order intercept point (IIP3) is increased and thus linearity of the LNA is improved.

13 Claims, 3 Drawing Sheets

MONOLITHIC CMOS DIFFERENTIAL LNA WITH ENHANCED LINEARITY

BACKGROUND OF THE INVENTION

1. Field of Invention

The present invention relates to a low noise amplifier (LNA) circuit, and more particularly, to a differential LNA circuit using integrated CMOS technology for enhanced linearity.

2. Description of the Related Art

In wireless application it is important to constrain power consumption. At the same time, the operating environment often dictates very high performance for the RF front-end. This is particularly accentuated in the case of CDMA systems, because they operate full-duplex (i.e. receiving and transmitting at the same time). It can be shown that, simultaneously with a lower noise figure, the low noise amplifier (LNA) must also have very high IIP3 (input-referred third-order intercept point).

Being a first stage of a wireless receiver, LNA plays a critical role in the entire wireless communication system. As CMOS technology advances, implementation of RF circuits is more and more attractive, such as LNA. In recent years, many CMOS LNAs have been effectively implemented.

Linearity is an important parameter for the LNA, which is one of the main factors dominating the application of CMOS LNA in the wireless systems with high performance requirements. Therefore, a differential LNA circuit with enhanced linearity and improved IIP3 using integrated CMOS technology is desired.

SUMMARY OF THE INVENTION

In accordance with one aspect of the present invention, a monolithic differential LNA structure with enhanced linearity is provided with higher IIP3.

According to another aspect of the invention, a monolithic differential LNA including a first cascode amplifying module feeding a second cascode amplifying module is provided.

According to yet another aspect of the present invention, the third-order harmonic frequency component of the differential LNA characteristics are simply eliminated by adjusting the sizes of the transistors of the amplifiers.

According to yet another aspect of the invention, the monolithic differential LNA is self-biased, where gate voltages of the differential inputs are set based on the drain voltages thereof.

A circuitry structure is provided in the differential LNA of the present invention. The LNA includes a first cascode amplifying module and a second cascode amplifying module, where the second cascode amplifying module is fed by the first cascode amplifying module, and outputs of these two amplifiers are combined thereof for canceling the third-order intermodulation (IM3) frequencies. Thus a much higher input-referred third-order intercept point (IIP3) is obtained consequently.

The present invention provides a low noise amplifier (LNA) circuit using CMOS technology, including a first cascode amplifying module and a second cascode amplifying module fed with differential inputs and thus generating differential outputs. The LNA circuit is supplied with a bias current provided by a transistor through a bias voltage. A plurality of inductors form a source degeneration structure, and a plurality of inductors along with a plurality of capacitors form resonant tanks coupled to the output terminals as the loads of the amplifier. Additionally, a plurality of off-chip devices used for impedance match at the inputs and outputs terminals may be provided but not necessarily mentioned in the present invention.

For the first cascode amplifying module and the second cascode amplifying module, four transistors are included respectively, coupled in a cascode fashion. The first cascode amplifying module includes four transistors being $M_1$, $M_2$, $M_3$, and $M_4$ respectively, while the second cascode amplifying module includes another four transistors being $M_{1a}$, $M_{2a}$, $M_{3a}$, and $M_{4a}$ respectively. The transistors of the first cascode amplifying module possess larger gate widths than those of the second cascode amplifying module, where $M_1$, $M_2$, $M_{1a}$, and $M_{2a}$ are input devices, and $M_3$, $M_4$, $M_{3a}$ and $M_{4a}$ are cascode devices. Where $M_1$, $M_2$ are identical, as well as $M_3$ and $M_4$ are. Same condition applies to the transistors of the second cascode amplifying module, meaning $M_{1a}$ and $M_{2a}$ being identical, and $M_{3a}$ and $M_{4a}$ being identical also gates of the input transistors, $M_{1a}$ and $M_{2a}$, of the second cascode amplifying module are AC-coupled to drains of the input transistors, $M_1$ and $M_2$, of the first cascode amplifying module respectively through capacitors $C_1$ and $C_2$.

In order to increase linearity and improve IIP3 of the LNA in this present invention, qualitative description is introduced hereinafter. First, while describing the widths of the transistors, the following formula defines the size of the transistors in the present invention:

$$\frac{(W/L)_1}{(W/L)_3} = \frac{(W/L)_{1a}}{(W/L)_{3a}} \tag{1}$$

where width of a transistor channel is noted as W, while length of a transistor channel is noted as L in the equation (1) and hereinafter.

Second, since the amplifiers are coupled in cascode fashion, the cascode common mode voltage of the second cascode amplifying module is sensed by two resistors, namely $R_3$ and $R_5$ coupled to the drains of the cascode transistors $M_{1a}$ and $M_{2a}$ respectively, at a node $BS_1$. The DC bias voltage of the input devices is generated at a node $BS_2$ by a resistor divider $R_4$–$R_9$, and is fed to the gates of the input transistors of the first cascode amplifying module, $M_1$ and $M_2$, and those of the second cascode amplifying module, $M_{1a}$ and $M_{2a}$. A voltage drop is caused by input resistance represented by $R_1$ and $R_7$ for the first cascode amplifying module input transistors, and by $R_2$ and $R_6$ for the second cascode amplifying module input transistors. The gates of $M_3$, $M_4$, and $M_{3a}$, $M_{4a}$ are similarly biased to the power supply voltage with voltage drops caused by $R_8$ and $R_{10}$ respectively.

According to the differential LNA in the present invention, providing the input/output transfer characteristic of the main differential amplifier follows the following form:

$$y_m(x)=\alpha_1 x+\alpha_3 x^3 \tag{2}$$

where $\alpha_1$ and $\alpha_3$ are constants, x being input variable and $y_m$ being output variable. Also providing the gain from the input of the first cascode amplifying module to the input of the second cascode amplifying module is B (B>0), if the signal loss between the two plates of capacitor $C_1$ and $C_2$ can be neglected, then $$B \approx \sqrt{\frac{(W/L)_1}{(W/L)_2}} \quad (3)$$

Furthermore, providing the ratio of the second cascode amplifying module gain to the first cascode amplifying module gain is A, the input/output characteristic of the auxiliary differential amplifier can be expressed by the following equation:

$$y_a(x) = \frac{1}{A}[\alpha_1(-Bx) + \alpha_1(-Bx)^3] \quad (4)$$

Since the first cascode amplifying module shares the same loads with the second cascode amplifying module, A is equal to the ratio of the auxiliary differential amplifier size to the first cascode amplifying module size, that is:

$$A \approx \sqrt{\frac{(W/L)_1}{(W/L)_{1a}}} \quad (5)$$

The total input/output characteristic of the LNA can be calculated as:

$$y_1(x) = \left(1 - \frac{B}{A}\right)\alpha_1 x + \left(1 - \frac{B^3}{A}\right)\alpha_3 x^3 \quad (6)$$

If proper sizes of the transistors in the LNA circuit of the present invention are selected to meet the following equation:

$$A = B^3 \quad (7)$$

then it is easily seen from equation (6) that the third order harmonic disappears with the penalty of signal gain reduced to $(1-1/B^2)$ times of the gain of the first cascode amplifying module. Since A and B are both determined by the sizes of the transistors, it is essential to adjust transistor sizes to meet the requirements described above.

The third order harmonic is eliminated and the linearity of the LNA is improved according to the working principle of the differential LNA described in this present invention.

DESCRIPTION OF THE EMBODIMENTS

Figure 1:
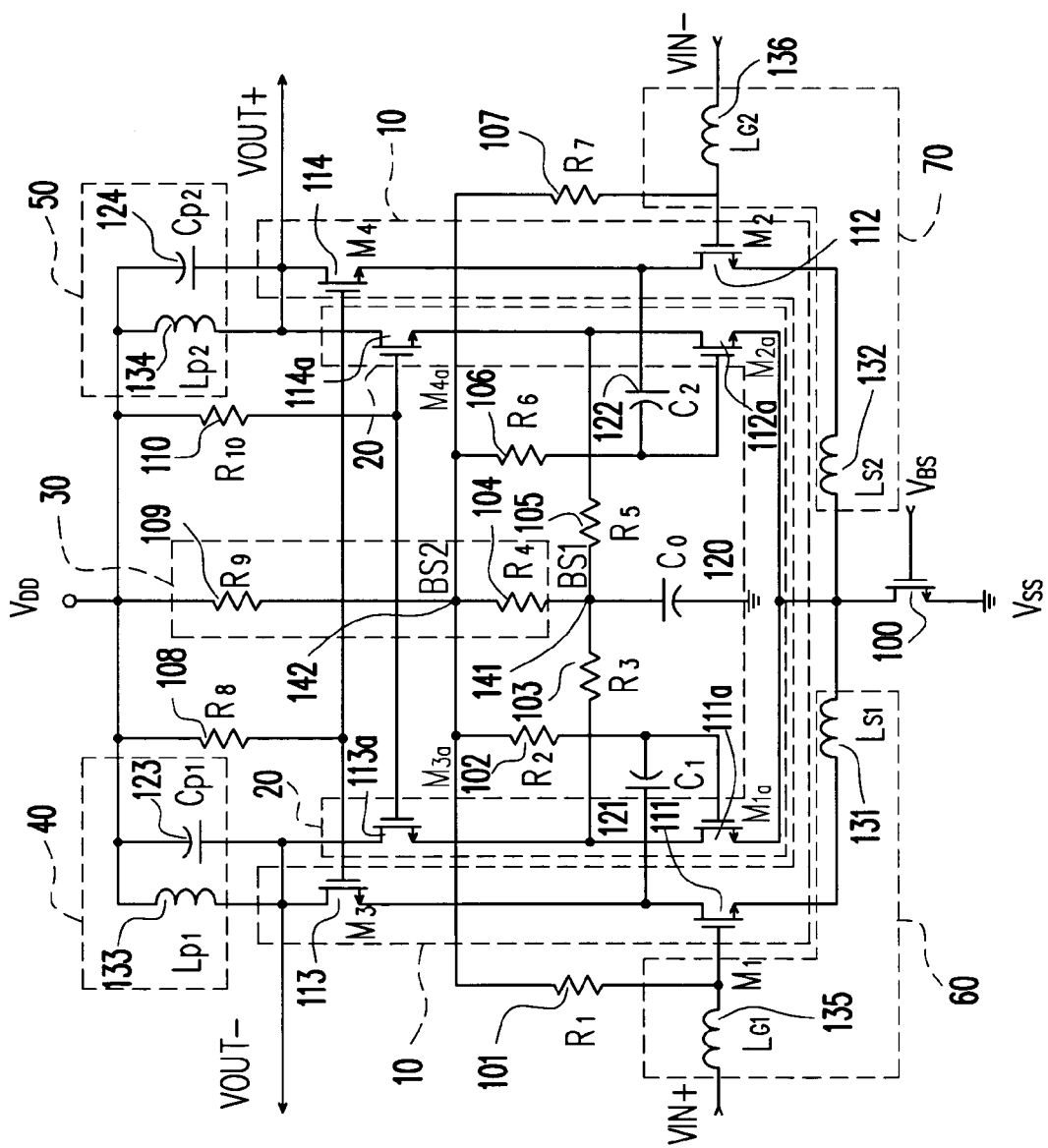
FIG. 1 is a schematic circuit diagram illustrating the high-IIP3 LNA according to an embodiment of the present invention.

Referring to FIG. 1, it illustrates a schematic circuit diagram of a low noise amplifier (LNA) according to an embodiment of the present invention. The LNA circuit includes a first cascode amplifying module 10 and a second cascode amplifying module 20, a voltage divider 30 for supplying DC voltage level, two LC tanks 40 and 50 as output loads, two inductive degeneration structures 60 and 70 coupled to the first cascode amplifying module 10, and a current source 100 for supplying current to the LNA. The LNA circuit further includes capacitive devices 121 and 122 serving as AC-coupled devices between drains of input transistors 111 and 112 of the first cascode amplifying module and gates of the input transistors 111a and 112a of the second cascode amplifying module, respectively.

The first cascode amplifying module 10 includes four transistors 111, 112, 113, and 114, as illustrated in FIG. 1, coupled in cascode differential fashion. Where the size of transistor 111 and that of transistor 112 are identical, whereas the size of transistor 113 and that of transistor 114 are identical. The gates of transistors 111 and 112 serve as a pair of differential inputs, respectively, while the drains of transistors 113 and 114 are coupled to the loading LC tanks 40 and 50, and differential outputs are read therefrom as well. On the other hand, the second cascode amplifying module also includes four transistors 111a, 112a, 113a, and 114a, according to one embodiment of the present invention. The four transistors are coupled similarly to that of the first cascode amplifying module, whereas two gates of the transistors 111a and 112a are AC-coupled to the drains of transistors 111 and 112 correspondingly, via two capacitive devices 121 and 122. Where the capacitive devices are capacitors, for example, in the embodiment of the present invention. Notice that the sizes of the transistors 112~114 of the first cascode amplifying module 10 are larger than those of the transistors 112a~114a of the second cascode amplifying module 20, and are constrained by the following equations to achieve high-IIP3 LNA in this disclosure.

$$\frac{(W/L)_{111}}{(W/L)_{113}} = \frac{(W/L)_{111a}}{(W/L)_{113a}} \quad (1)$$

where $(W/L)_x$ refers to the ratio of channel width over channel length of the transistor x. Since the differential amplifier circuits are symmetrical in the present invention, the ratio to the feature of 112 over that of 114 is equal to that feature of 112a over that of 114a accordingly.

The cascode common mode voltage of the second cascode amplifying module is sensed by two resistors, namely 103 and 105 coupled to the drains of the input transistors 111a and 112a thereof, at a node 141 before coupled to ground voltage level via a capacitive device. The DC bias voltage of the input devices is generated at a node 142 by a resistor divider 104–109 and is fed to the gates of the input devices of the first cascode amplifying module 10 and the second cascode amplifying module 20. The DC voltage level is respectively dropped before feeding to the input devices of the first cascode amplifying module 10 and the second cascode amplifying module 20 by resistors 101, 107, 102, and 106, for example. The gates of $M_3$, $M_4$, and $M_{3a}$, $M_{4a}$ are similarly biased to the power supply voltage with voltage drops caused by $R_8$ and $R_{10}$ respectively.

Furthermore, the current source 100 in the LNA circuitry of this present invention includes a transistor controlled by a bias voltage level. The first LC tank 40 includes a pair of inductor 133 and a capacitor 123, while the second LC tank 50 includes a pair of inductor 134 and a capacitor 124, coupled in parallel between a voltage supply VDD and the differential output terminals VOUT+ and VOUT respectively. Moreover, the first inductive degeneration structure 60 includes two inductors 131 and 135, respectively coupled between the current source 100 and a source of the transistor 111, and coupled between the gate of the transistor 111 and the positive input terminal. Similarly, the second inductive degeneration structure 70 includes two inductors 132 and 136, respectively coupled between the current source and a source of the transistor 112, and coupled between the gate of the transistor 112 and the negative input terminal.

In an embodiment of the present invention, providing the input/output transfer characteristic of the main differential amplifier follows the following form:

$$y_{10}(x) = \alpha_{111}x + \alpha_{113}x^3 \quad (2)$$

where $\alpha_{111}$ and $\alpha_{113}$ are characteristic constants of transistor 111 and transistor 113 respectively. Also providing the gain from the input of the first cascode amplifying module to the input of the second cascode amplifying module is B (B>0), if the signal loss between the two plates of capacitor $C_1$ and $C_2$ can be neglected, then $$B \approx \sqrt{\frac{(W/L)_{111}}{(W/L)_{112}}} \quad (3)$$

Providing the ratio of the second cascode amplifying module gain to the first cascode amplifying module gain is A, the input/output characteristic of the auxiliary differential amplifier can be expressed by the following equation:

$$y_{20}(x) = \frac{1}{A}[\alpha_{111}(-Bx) + \alpha_{111}(-Bx)^3] \quad (4)$$

where $\alpha_{111}$ is a characteristic constant of transistor 111.

Since the first cascode amplifying module 10 shares the same loads with the second cascode amplifying module 20, A is equal to the ratio of the auxiliary differential amplifier size to the first cascode amplifying module size, that is:

$$A \approx \sqrt{\frac{(W/L)_{111}}{(W/L)_{111a}}} \quad (5)$$

The total input/output characteristic of the LNA can be calculated as:

$$y_1(x) = \left(1 - \frac{B}{A}\right)\alpha_{111}x + \left(1 - \frac{B^3}{A}\right)\alpha_{113}x^3 \quad (6)$$

If proper sizes of the transistors in the circuit are selected to meet the following equation:

$$A = B^3 \quad (7)$$

then it is easily seen from equation (6) that the third order harmonic disappears with the penalty of signal gain reduced to $(1-1/B^2)$ times of the gain of the first cascode amplifying module 10. Since A and B are both determined by the sizes of the transistors, it is essential to adjust transistor sizes to meet the requirements described above.

The third order harmonic is eliminated and the linearity of the LNA is improved according to the working principle of the LNA circuitry in the embodiment of the present invention. Linearity and IIP3 improvements are demonstrated hereinafter referring to FIGS. 2 to 4.

Figure 2:
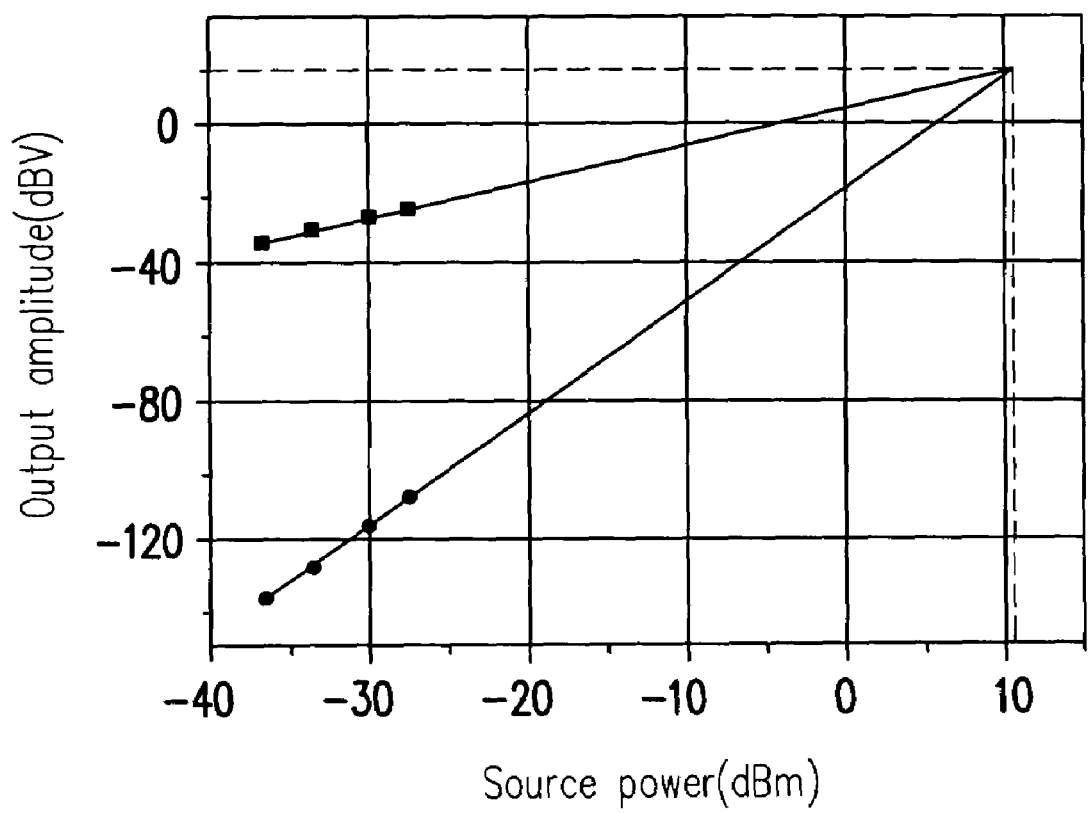
FIG. 2 is a schematic transfer function diagram illustrating two-tone IIP3 result of the LNA according to an embodiment of the present invention.

Referring to FIG. 2, a two-tone test result for the linearity of the LNA according to an embodiment of the present invention is illustrated. Providing 0.18 μm 1P6M Analog/RF CMOS process is used, RF model library is selected, parasitic of pads and bond wires is included, and 10 mA current is drawn from a 1.8V power supply voltage for the embodiment of the present invention. For the skill in the art, it is seen that the IIP3 of the LNA according to the present invention is 10.7 dBm, which proves validity of the circuitry according to the present invention for improving the linearity of LNA.

Figure 3:
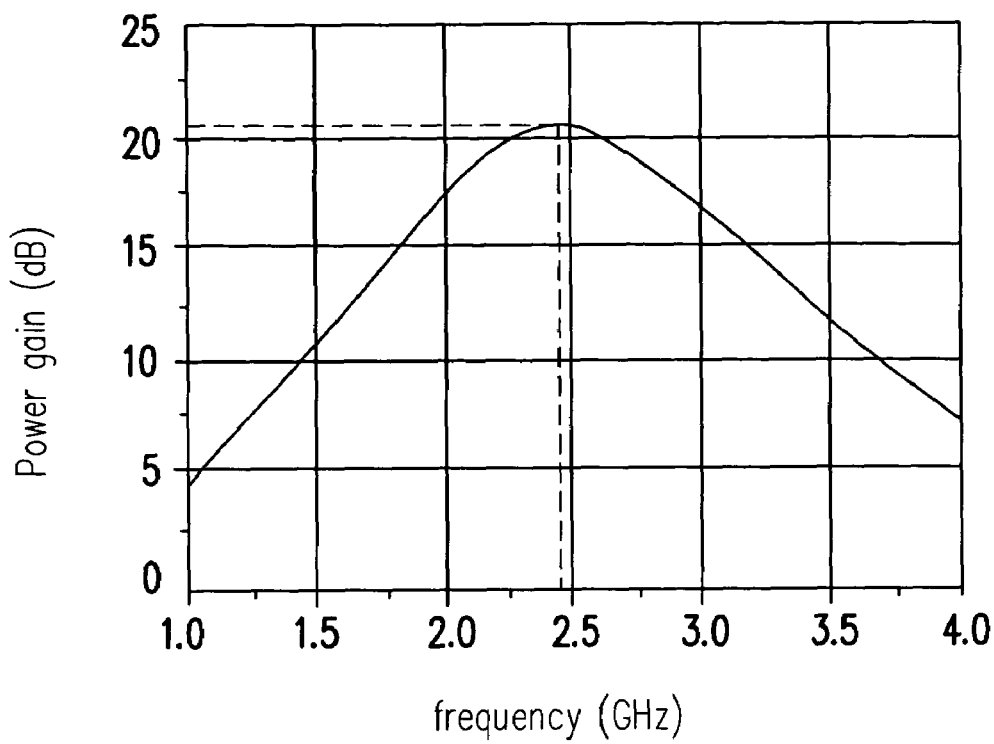
FIG. 3 is a schematic diagram illustrating power gain of the LNA according to an embodiment of the present invention.

Referring to FIG. 3, a power gain of the LNA according to one embodiment of the present invention is depicted. A power gain of 20.4 dBm is demonstrated.

Figure 4:
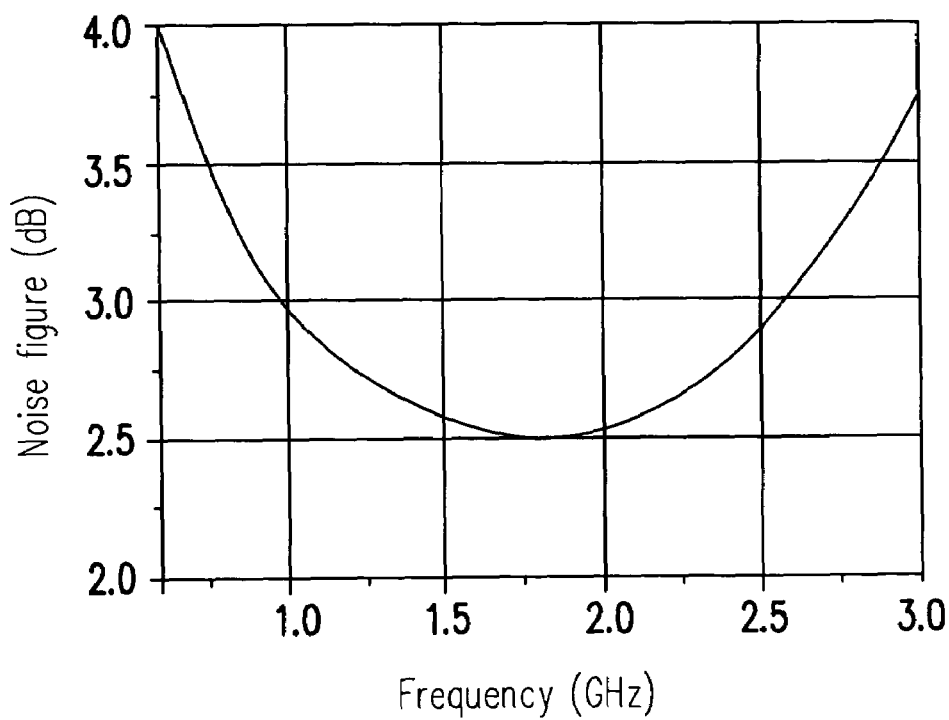
FIG. 4 is a schematic diagram illustrating noise figure of the LNA according to an embodiment of the present invention.

Referring to FIG. 4, a noise figure of the LNA according to one embodiment of the present invention is depicted. The noise figure of is 2.8 dB at 2.4 GHz Although the invention has been described with reference to a particular embodiment thereof, it will be apparent to those skilled in the art that modifications to the described embodiment may be made without departing from the spirit of the invention. Accordingly, the scope of the invention will be defined by the attached claims and not by the above detailed description.

What is claimed is:

1. A low noise amplifying (LNA) circuitry, having a differential input pair consisting of a positive input terminal and a negative input terminal, and a differential output pair consisting of a positive output terminal and a negative output terminal, comprising:
    a first cascode amplifying module;
    a second cascode amplifying module;
    a current source, controlled by a bias voltage level, for supplying current to the LNA circuitry;
    a first resonant tank, coupled to the negative output terminal as output load; and
    a second resonant tank, coupled to the positive output terminal as output load;
    wherein,
    the first cascode amplifying module comprises:
    a first transistor, having a channel width/length ratio r1,
    a second transistor, having a channel width/length ratio r2,
    a third transistor, having a channel width/length ratio r3, and
    a fourth transistor, having a channel width/length r4; and
    the second cascode amplifying module comprises:
    a first auxiliary transistor, having a channel width/length ratio r1',
    a second auxiliary transistor, having a channel width/length ratio r2',
    a third auxiliary transistor, having a channel width/length ratio r3', and
    a fourth auxiliary transistor, having a channel width/length ratio r4', wherein r1, r2, r3, r4, r1', r2', r3', and r4' are selected such that $$r4 = r3, r4' = r3', \frac{r_1}{r_3} = \frac{r_1'}{r_3'}, B \approx \sqrt{\frac{r_1}{r_2}}, A \approx \sqrt{\frac{r_1}{r_1'}}, \text{ and } A = B^3,$$

and
the ratios of the first, second, third and fourth transistors are later than those of the first, second, third and fourth auxiliary transistors.

2. The circuitry as recited in claim 1 further comprising:
a first source degeneration structure, coupled between the positive input terminal, the first cascode amplifying module, and the current source;
a second source degeneration structure, coupled between the negative input terminal, the first cascode amplifying module, and the current source;
a first sensing device coupled to a first node and a first intermediate node of the second cascode amplifying module;
a second sensing device, coupled to the first node and a second intermediate node of the second cascode amplifying module;
a voltage divider, having a fourth resistive device and a ninth resistive device coupled at a second node, between a voltage supply and the first node for providing a second voltage level at the second node;
a first AC-coupled device, coupled between the first cascode amplifying module and a second cascode amplifying module; and
a second AC-coupled device, coupled between the first cascode amplifying module and a second cascode amplifying module.

3. The circuitry as recited in claim 1, wherein the first resonant tank comprises a first parallel inductive device and a first parallel capacitive device coupled in parallel to as a load of the negative output terminal.

4. The circuitry as recited in claim 1, wherein the second resonant tank comprises a second parallel inductive device and a second parallel capacitive device coupled in parallel as a load of the positive output terminal.

5. The circuitry as recited in claim 2, wherein the current source comprises an n-type transistor.

6. The circuitry as recited in claim 2, wherein the first sensing device comprises a resistive device.

7. The circuitry as recited in claim 2, wherein the second sensing device comprises a resistive device.

8. The circuitry as recited in claim 2, wherein the fourth resistive device and the ninth resistive device are resistors.

9. The circuitry as recited in claim 2, wherein the first AC-coupled device comprises a capacitive device.

10. The circuit as recited in claim 2, where in the second AC-coupled device comprises a capacitive device.

11. The circuitry as recited in claim 1, wherein the first transistor, the second transistor, the third transistor, and the fourth transistor are n-type transistors.

12. The circuitry as recited in claim 1, wherein the first auxiliary transistor, the second auxiliary transistor, the third auxiliary transistor, and the fourth auxiliary transistor are n-type transistors.

13. The circuitry as recited in claim 1, wherein the first source degeneration structure comprises a first inductive device coupled between a source of the first transistor and the current source and a third inductive device coupled between the positive input terminal and a gate of the first transistor, and the second source degeneration structure comprises a second inductive device coupled between a source of the second transistor and the current source and a fourth inductive device coupled between the negative input terminal and a gate of the second transistor.

* * * * *